United States Patent [19]
Kitagawa et al.

[11] Patent Number: 5,554,877
[45] Date of Patent: Sep. 10, 1996

[54] COMPOUND SEMICONDUCTOR ELECTROLUMINESCENT DEVICE

[75] Inventors: Masahiko Kitagawa, Nara-Ken; Yoshitaka Tomomura, Nara, Japan

[73] Assignee: Sharp Kabushiki Kaisha, Osaka, Japan

[21] Appl. No.: 938,536

[22] Filed: Sep. 2, 1992

Related U.S. Application Data

[63] Continuation of Ser. No. 635,424, Jan. 3, 1991, abandoned, which is a continuation of Ser. No. 347,274, May 4, 1989, abandoned.

[30] Foreign Application Priority Data

May 6, 1988 [JP] Japan ................... 63-110910

[51] Int. Cl.⁶ .................... H01C 29/78; H01L 33/00
[52] U.S. Cl. .................................. 257/474; 257/476
[58] Field of Search ................. 357/55, 17, 23.15, 357/30; 257/474, 476

[56] References Cited

U.S. PATENT DOCUMENTS

| | | | |
|---|---|---|---|
| 3,597,667 | 8/1971 | Horn | 317/235 |
| 3,855,607 | 12/1974 | Kressel et al. | 357/18 |
| 3,914,785 | 10/1975 | Ketchow | 357/63 |
| 3,936,855 | 2/1976 | Goell et al. | 357/17 |
| 3,952,323 | 4/1976 | Tanimura | 357/15 |
| 4,060,828 | 11/1977 | Satonaka | 257/774 |
| 4,065,780 | 12/1977 | Ballantyne | 357/6 |
| 4,587,543 | 5/1986 | Ohtani et al. | 357/25 |
| 4,751,560 | 6/1988 | Rosbeck | 257/461 |
| 4,918,497 | 4/1990 | Edmond | 357/17 |

FOREIGN PATENT DOCUMENTS

| | | | |
|---|---|---|---|
| 0310353 | 4/1989 | European Pat. Off. | 357/30 |
| 0057126 | of 1974 | France . | |
| 3436927 | 4/1986 | Germany | 357/30 |
| 58-68990 | 4/1983 | Japan | 357/17 |
| 60-81876 | 5/1985 | Japan | 357/30 |
| 1031043 | of 1966 | Switzerland . | |

*Primary Examiner*—Stephen D. Meier

[57] ABSTRACT

An electroluminescent device of compound semiconductor includes a compound semiconductor substrate having at least one through-hole, an electroluminescent part consisting of a plurality of epitaxial compound semiconductor layers formed on the substrate, and at least a pair of electrodes having external leads in which one electrode is connected to the uppermost layer of the electroluminescent part and another electrode is directly connected to the lowest layer of the electroluminescent part through the through-hole of the substrate. Thereby, a voltage from an external source is enabled to be directly applied to the electroluminescent part.

3 Claims, 5 Drawing Sheets

COMPOUND SEMICONDUCTOR ELECTROLUMINESCENT DEVICE

This application is a continuation-in-part of application Ser. No. 07/635,424 filed on Jan. 3, 1991, now abandoned; which was a continuation of application Ser. No. 07/347,274 filed on May 4, 1989, now abandoned.

BACKGROUND OF THE INVENTION

1. Field of the Invention

The present invention relates to an electroluminescent device of compound semiconductor. More particularly, it is concerned with an electroluminescent device which comprises an electroluminescent part of a compound semiconductor disposed on a compound semiconductor substrate.

2. Description of the Prior Art

Figure 6:
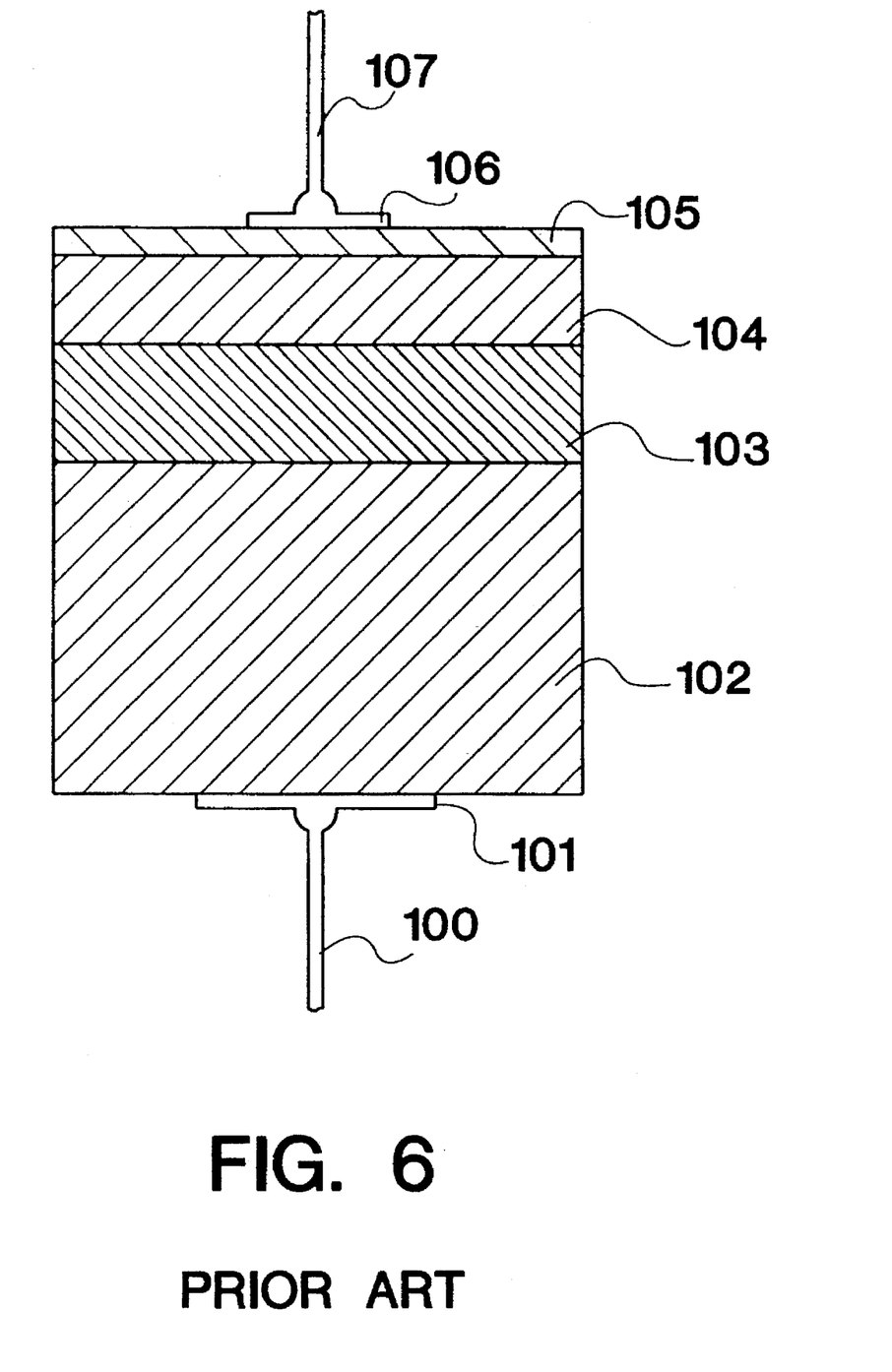
FIG. 6 is a view showing the construction of conventional electroluminescent device.

Group II–VI compound semiconductors, such as zinc sulfide (ZnS) and zinc selenide (ZnSe), are used for making short-wavelength electroluminescent devices which produce light having a blue color (IEEE TRANSACTIONS ON ELECTRON DEVICES, Vol. ED-30, p.271 (1983)). FIG. 6 illustrates the basic construction of the conventional electroluminescent devices manufactured from those materials. FIG. 6 is a cross sectional view of a metal-insulator-semiconductor (MIS) type electroluminescent device using ZnS, in which elements 100 and 107 are lead wires (e.g. Au wires), element 101 is a metal electrode (e.g. In or Al), layer 102 is a low-resistance n-type ZnS substrate, layer 103 is an epitaxial low-resistance n-type ZnS conductive layer, layer 104 is an epitaxial low-resistance n-type ZnS light-emitting layer, layer 105 is an epitaxial high-resistance ZnS layer for carrier injection, and element 106 is a metal electrode (e.g. Au). The layers 103, 104 and 105 form an electroluminescent part to which a voltage is applied through the ZnS substrate 102. Therefore, it is impossible to use a bulk single crystal of high-resistance ZnS as the substrate ZnS 102 which is, for example, gown by an iodine transport method. Thus, a bulk single crystal is usually used as the substrate which has been subjected to a long period of heat treatment in a solution of 90% Zn and 10% Al for about 100 hours at a high temperature of about 1000° C. to lower its resistivity to a level of 10 to 1 Ω·cm and cut to have a thickness of 300 to 1000 microns.

The epitaxial ZnS layers (electroluminescent part) consisting of three layers on the substrate is formed by, for example, molecular-beam epitaxy (MBE). The epitaxial conductive layer 103 and the epitaxial light-emitting layer 104 are obtained by using Al or Cl, etc., as an impurity having a resistivity of $10^{-2}$ to $10^{-3}$ Ω·cm. The layers are composed of a high quality crystal having a resistivity which is lower by as many as two to four figures of magnitude than the resistivity of the substrate 102.

It has also been necessary to carry out heat treatment at 450° C. in a highly pure gas atmosphere for a period of several seconds to several minutes after the formation of the metal electrodes 101 and 107 when forming ohmic contacts with the n-type ZnS substrate 102.

In summary, the conventional device manufacturing process has the drawback of requiring a long period of heat treatment at a high temperature when preparing the n-type ZnS substrate of low resistance. Also, heat treatment of the electrodes on the substrate at a temperature which is approximately equal to, or even higher than, the temperature at which the epitaxial layers, including the light-emitting layer, are grown, as hereinabove pointed out.

Another drawback of the conventional art has been that the majority of loss in the semiconductor portions of the electroluminescent device occurs in the substrate, because the substrate has a resistance which is as high as 1 to 10Ω, while the light-emitting and conductive layers have a total resistance of $10^{-3}$ to $10^{-4}$Ω. Further, the use of a ZnS substrate which is not satisfactorily low in resistivity has brought about a serious drawback from the standpoint of practical applications. When finely divided patterns are formed on the substrate, or very small chips having a size in the order of 100 microns are formed, in order to make a monolithic display device, the luminescent portions or chips have a high serial resistance.

These drawbacks have also been found to occur in the electroluminescent devices made by employing a substrate formed from a Group III–V compound semiconductor, such as GaAs (IEEE TRANSACTIONS ON ELECTRON DEVICES, VOL. ED-24, No. 7, July 1977).

The present invention has been made to overcome the drawbacks which have hereinabove been pointed out.

SUMMARY OF THE INVENTION

According to the present invention, there is provided an electroluminescent device of compound semiconductor which comprises a compound semiconductor substrate having at least one through-hole, an electroluminescent part consisting of a plurality of epitaxial compound semiconductor layers formed on the substrate, and at least a pair of electrodes with external leads in which one electrode is connected to the uppermost layer of the electroluminescent part and another electrode is directly connected to the lowest layer of the electroluminescent part through the through-hole of the substrate. Thereby, enabling a voltage from an external source is enabled to be directly applied to the electroluminescent part.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The compound semiconductor substrate in the device of the present invention is formed from a bulk single crystal of a Group II–VI compound semiconductor, such as ZnS, ZnSe, ZnTe, ZnSSe or ZnSTe, or a Group III–V compound semiconductor, such as GaP or InP. A conventional treatment for lowering the resistance is not required, but a wafer formed from a bulk single crystal and having a high resistivity of $10^6$ to $10^{16}$ (an insulating or a semiinsulating property) can be used directly as the substrate.

The electroluminescent part in the device of the present invention consists of a plurality of epitaxial compound semiconductor layers and is usually formed by epitaxy from the same compound semiconductor that is used for making the substrate. The semiconductor layers are so formed as to have different functions which are required by a particular electroluminescent mode. For example, a MIS type electroluminescent part may be formed by the epitaxial growth of a low-resistance n-type (or p-type) conductive layer, a low-resistance n-type (or p-type) light-emitting layer and a high-resistance layer for carrier injection in the order in which they have been mentioned. A p-n junction type electroluminescent part may be formed by the epitaxial growth of a low-resistance p-type (or n-type) first conductive layer, a low-resistance p-type (or n-type) first light-emitting layer, a low-resistance n-type (or p-type) second light-emitting layer and a low-resistance n-type (or p-type) second conductive layer in the above described order. Other constructions of the electroluminescent part are, of course, possible, as will hereinafter be described by way of example.

According to the present invention, the electrode disposed adjacent to the substrate is directly connected to the electroluminescent part, usually the lowest low-resistance conductive layer, through the through-hole of the substrate. This hole may be in the form of a groove extending through the substrate and can be formed in any shape corresponding to the shape of the electrode by employing various etching techniques. The hole can be formed by, for example, reactive ion-beam or chemical etching. The hole may be formed through the substrate either before the electroluminescent part is formed, or thereafter. The formation of the electrode through the hole of the substrate may be accomplished by, for example, vapor deposition, sputtering or MBE. The electrode can be formed from various kinds of metals that have hitherto been employed, for example, In, Al or Au. In any event, if the electrode is formed directly on the low-resistance conductive layer of each electroluminescent part, an ohmic electrode will be formed which does not require any special after-treatment. The other electrode can be formed by a similar process on the uppermost layer of the electroluminescent part.

The shape of the electrodes and the number of the electrode pairs in the electroluminescent device of the present invention are selected appropriately in accordance with the purpose for which it is intended. Therefore, it is possible to make either a segment or matrix type electroluminescent display device as will hereinafter be described by way of example. The use of a compound semiconductor of high resistance close to an insulator for the substrate is of great advantage in the construction of the device, because the compound semiconductor serves as a zone of isolation between the device units.

When the electrode provided adjacent to the substrate in the device of the present invention is directly connected to the electroluminescent part grown epitaxially on the substrate, voltage can be applied efficiently to the electroluminescent layer without passing through the substrate and being lost thereto. Therefore, the device has a high output and can produce light having a high degree of brightness. Moreover, a display device can be formed which has a drastically lowered overall serial resistance. Moreover, the electroluminescent device is easy to make without relying upon any special high-temperature heat treatment of the kind employed in the past, because the electrode connected to the electroluminescent part can easily form an ohmic contact.

Furthermore, the present invention makes it possible to use a compound semiconductor of high resistance which has hitherto not been used, particularly a bulk single crystal thereof, for the substrate. Therefore, the isolation of a plurality of electroluminescent devices employed to form one chip is simplified and facilitated.

The preferred embodiments of the present invention will now be described in further detail by way of examples.

Figure 1:
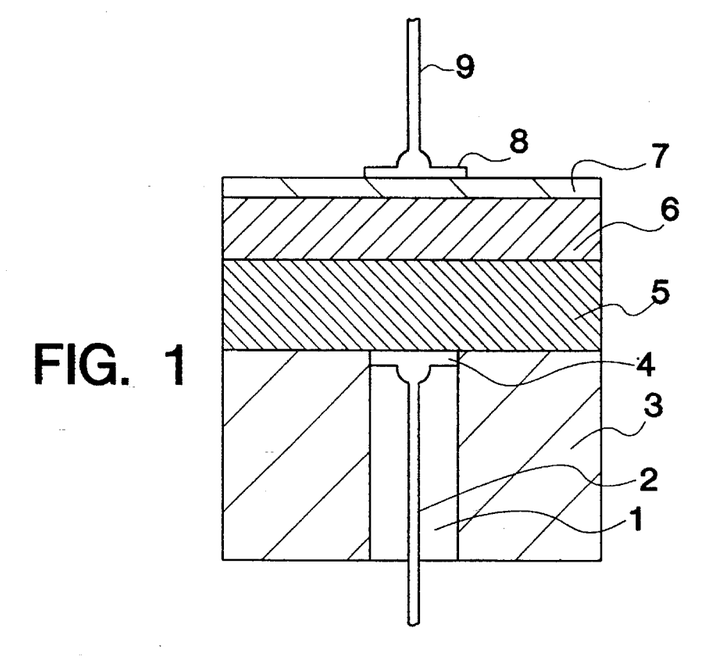
FIGS. 1 to 5 are each a view illustrating the construction of electroluminescent devices according to the first to fifth embodiments of the present invention.

FIG. 1 is a cross sectional view schematically illustrating the construction of the electroluminescent device according to a first embodiment of the present invention. In FIG. 1, element 1 is a through-hole extending through a ZnS substrate, elements 2 and 9 are metal lead wires (Au), layer 3 is a semiinsulator ZnS substrate of high resistance having a resistivity of $10^8$ to $10^{10}$ $\Omega$·cm, element 4 is an ohmic metal electrode (In) formed on a homoepitaxial ZnS conductive layer, layer 5 is the epitaxial low-resistance n-type ZnS conductive layer, layer 6 is an epitaxial low-resistance n-type ZnS light-emitting layer, layer 7 is an epitaxial high-resistance ZnS layer for carrier injection, and element 8 is a positive metal electrode (Au).

The semiconductor layers 5, 6 and 7 on the substrate 3 are homoepitaxially grown upon each other by a MBE (molecular beam epitaxy) process. These homoepitaxially grown layers can also be formed by an organometallic chemical vapor deposition (MOCVD). The substrate 3 typically has a thickness of 300 microns, but a thickness between 100 and 1000 microns may be formed. The conductive layer 5 has a thickness of 1 to 10 microns and a carrier concentration of $10^{18}$ to $10^{20}$ cm$^{-3}$. The light-emitting layer 6 has a thickness of 0.5 to 5 microns and a carrier concentration of $10^{16}$ to $10^{18}$ cm$^{-3}$. The high-resistance layer 7 has a thickness of 2 to 50 nm. The high-resistance layer 7 is formed from undoped ZnS, or ZnS which is doped with Si, Ge, or a common combination of Group III or VII and Group I or V impurities.

Although a material of high resistance (dielectric, semiconductor, etc.) other than ZnS is also effective for forming the high-resistance layer, on an average ZnS film is higher in uniformity. Aluminum (Al) of Group III was employed as the n-type impurity, though similar results could be obtained from the use of, for example, indium (In), gallium (Ga) or thallium (Tl) of Group III, tellurium (Te) or oxygen (O) of Group VI, iodine (I), bromine (Br), chlorine (Cl) or fluorine (F) of Group VII, or silicon (Si) or germanium (Ge) of Group IV. When MBE is caused to take the place in an ultrahigh vacuum having a back pressure of $10^{-9}$ to $10^{-10}$ torr, a high carrier concentration reaching a maximum of $10^{18}$ to $10^{20}$ cm$^{-3}$ is obtained irrespective of the impurity which is employed, and an epitaxial film of high quality having a low degree of doping compensation is obtained (more than 90% of Al atoms acted as donors in ZnS:Al doped with $4.9 \times 10^{19}$ cm$^{-3}$ of Al atoms, which could give rise to $2 \times 10^{-3}$ $\Omega$·cm low resistivity).

The hole 1 can be formed accurately with a very small radius of 50 to 500 microns, both when it was formed as a via hole after the epitaxial layers 5 to 7 have been grown, and when it was formed as a through-hole in the substrate 3 before the layers 5 to 7 are grown. The holes are formed mainly by reactive ion-beam etching (RIE), but holes having a large radius over about 500 microns can be formed by chemical etching, too. The electrode 4 (In) on the conductive layer 5 is formed by vapor deposition in an ultrahigh vacuum having a pressure not exceeding $10^{-9}$ torr and is an ohmic electrode of very high quality. The metal electrode 8 (Au) on the layer 7 is also formed by vapor deposition in an ultrahigh vacuum.

The electroluminescent device constructed as illustrated in FIG. 1 emits blue light having a wide wavelength range with a peak in the vicinity of 460 nm from the luminescent centers which are introduced by the n-type impurity (e.g. Al) added to the light-emitting layer. The light provides a degree of brightness higher than 20 mcd at conditions of 5 V and 20 mA and a high degree of stability (more than 1000 hours) in a limited path of an electric current corresponding to the electrode which is formed in the via hole 1 which extends through the substrate 3. Although the driving voltage, current and spectrum of the device depends on the thickness of the high-resistance layer 7, the thickness of the light-emitting layer 6, the carrier concentration thereof, and the dimensions of the electrodes, etc., a high degree of brightness is observed at a voltage of 5 to 20 V and a current of 10 μA/mm$^2$ to 10 mA/mm$^2$ as described above. The device was found useful as an ultraviolet light-emitting device too, because the device produced ultraviolet light having a wavelength in the vicinity of 340 nm in addition to the blue light (470 nm).

As is obvious from the first embodiment which has hereinabove been described, the present embodiment makes it possible to realize a highly efficient MIS type ZnS electroluminescent device having drastically improved characteristics by ensuring a path of an electric current through the electrode in the hole of the substrate when emitting light, and capable to produce light of a high degree of brightness.

Figure 2:
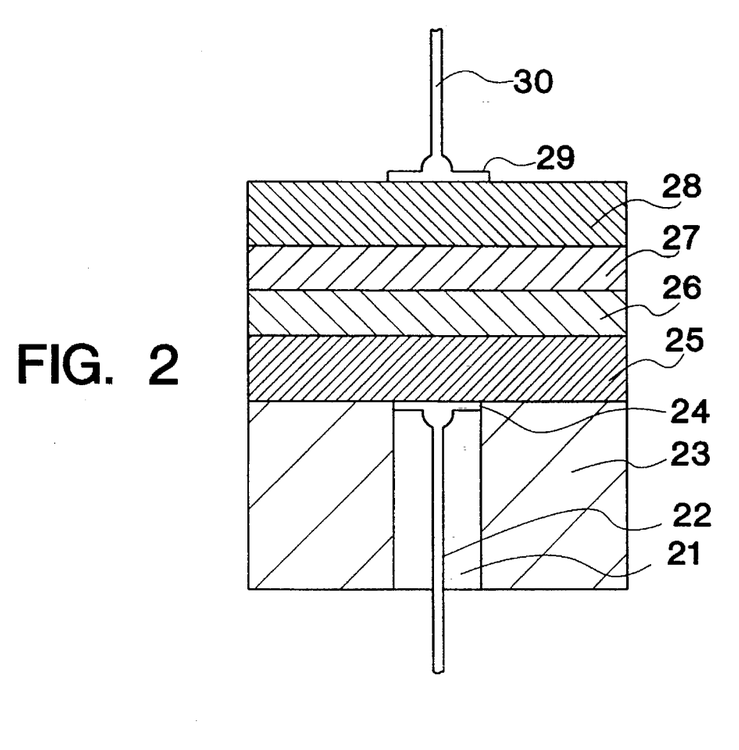

A second embodiment of the present invention is illustrated in FIG. 2. The device is a ZnSe p-n junction type light-emitting diode formed on a single-crystal ZnSe substrate. In FIG. 2, element 21 is a through groove, element 22 is a lead wire, layer 23 is a semiinsulator ZnSe substrate of high resistance having a resistivity of 10$^6$ to 10$^{15}$ Ω·cm, element 24 is a metal (In) electrode, layer 25 is a low-resistance p-type epitaxial ZnSe conductive layer, layer 26 is a low-resistance p-type epitaxial ZnSe light-emitting layer, layer 27 is a low-resistance n-type epitaxial light-emitting layer, layer 28 is a low-resistance n-type epitaxial ZnSe conductive layer, element 29 is a metal (Au) electrode, and element 30 is a lead wire.

The substrate 23 is formed from a bulk single crystal grown by an iodine transport, a sublimation, or a high-pressure melting process. All of the semiconductor layers and the electrodes are formed by MBE and the groove is made by RIE. The device is substantially identical to the ZnS device of the first embodiment, as far as the principal aspects, such as the processes of formation, dimensions and properties, are concerned. Although lithium (Li) of Group I was employed as the impurity for forming the p-type layers, similar results can be obtained by using sodium (Na), potassium (K), rubidium (Rb), copper (Cu), silver (Ag) or gold (Au) of Group I, thallium (Tl) of Group III, silicon (Si) or germanium (Ge) of Group IV, nitrogen (N), phosphorus (P), arsenic (As) or antimony (Sb) of Group V or tellurium (Te) or oxygen (O) of Group VI. The low-resistance conductive layer 25 has a thickness of 1 to 10 microns and a carrier concentration of 10$^{17}$ to 5×10$^{18}$ cm$^{-3}$, and the low-resistance light-emitting layer 26 has a thickness of 0.5 to 5 microns and a carrier concentration of 10$^{15}$ to 5×10$^{17}$ cm$^{-3}$.

The substrate 23 of ZnSe which is formed from the crystal grown by sublimation is substantially colorless and transparent which permits blue light to be irradiated therethrough. When the substrate 23 is formed from the crystal made by the iodine transport or the high-pressure melting process, however, the substrate obtains a yellow or orange color. Therefore, it is necessary to pick out blue light through the side of the device on which the upper electrode 29 is present. When the order of the p- and n-type layers in the device of FIG. 2 are reversed, substantially the same results are obtained, even though blue light is picked out more efficiently through the n-type layers. When a path of an electric current supplied to the device of FIG. 2 is also restricted by the dimensions and shapes of the electrodes, the current flow is limited through a very small area of the electrode and 1 mA of the current produces a luminance of at least 50 fL (foot-lamberts) which is higher by at least one degree of magnitude thou the luminance obtained by the application of an equivalent amount of current to a conventional device.

The present embodiment can be embodied very effectively in a p-n junction type electroluminescent device. However, the device is, not limited to a ZnSe electroluminescent device, but may be entirely and equally applicable to other devices having various types of junctions, such as a ZnS p-n junction, a ZnS$_x$Se$_{(1-x)}$ p-n junction, a ZnS$_y$Te$_{(1-y)}$ p-n junction and a ZnS-ZnSe p-n junction.

Figure 3A:
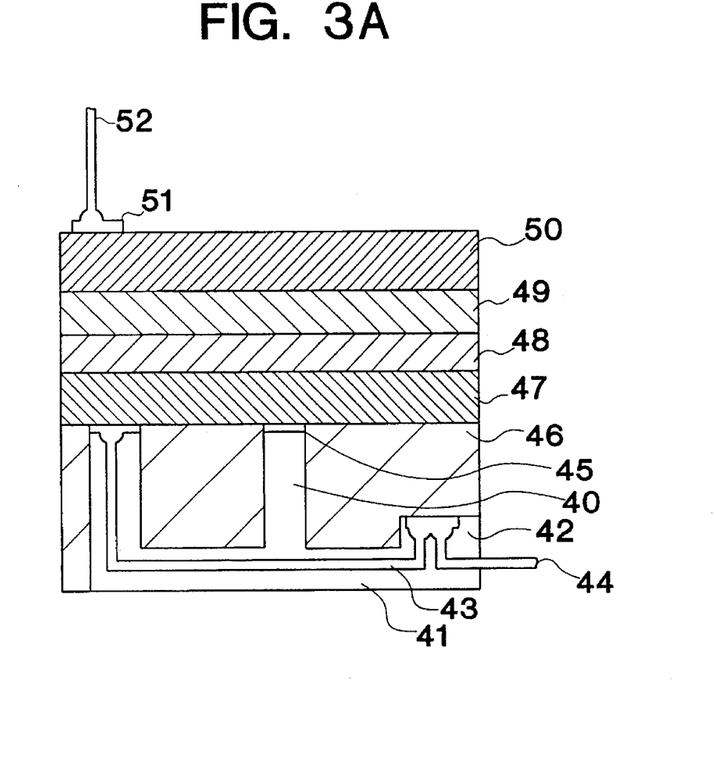
Figure 3B:
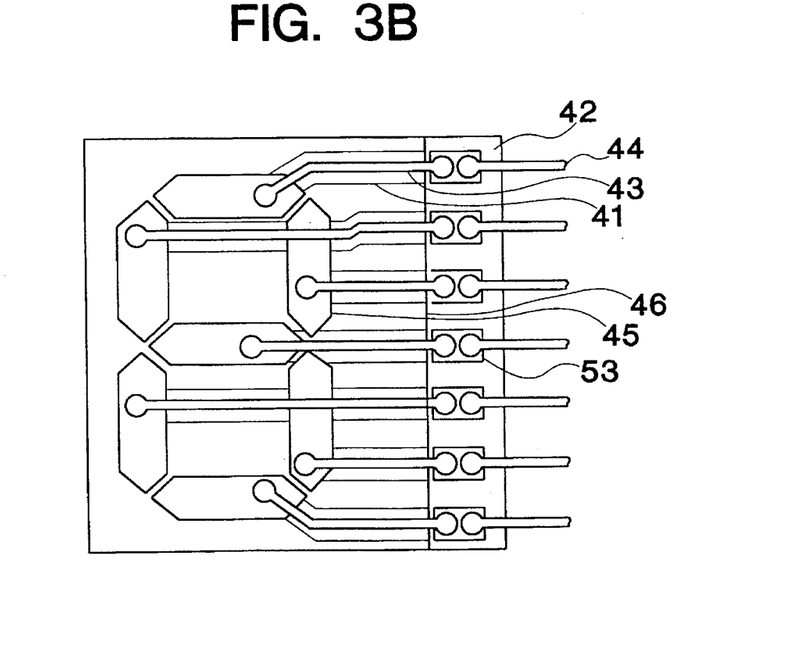

A third embodiment of the present invention is illustrated in FIG. 3. This device is a specific example for a one-chip numerical display device based on the second embodiment. In FIG. 3, A is a cross sectional view of the device and B is a bottom plan view thereof. The substrate has a multiplicity of through holes formed by RIE to provide the necessary number of segments in one chip. The semi-insulator ZnSe substrate 46 of high resistance having a resistivity of 10$^6$ to 10$^{15}$ Ω·cm ensures isolation between the segments from each other. The numerals 47, 48, 49 and 50 each corresponds to the numerals 25, 26, 27 and 28 in FIG. 2. The properties and dimensions of the epitaxial layers in the device are substantially equal to those in the device according to the second embodiment.

The semiinsulator ZnSe substrate 46 is provided with electrode forming through holes 40 for forming a pattern of electrode segments 45 which define display segments and segment lead channels 41 in which metal lead wires (segment lead wires 43) extending from the segments and a lead connecting end channel 42. The segment electrodes 45 and lead connecting terminals 53 are connected by the segment lead wires 43 which may be an evaporated metal segment lead. The one-chip electroluminescent display device includes an upper metal electrode 51 which is common to all the segments, and a low-resistance n-type epitaxial ZnSe conductive layer 50 which is adjusted to have a thickness of at least 10 microns, a carrier concentration of at least 5×10$^{18}$ cm$^{-3}$ and a resistivity not exceeding 10$^{-3}$ Ω·cm. The common metal electrode 51 is formed on the back side of the n-type conductive layer 50 through passage extending from the back side of the substrate to the surface of the layer 50 which is formed by an etching process. Therefore, it is very easy to juxtapose the electrode with the segment lead connecting terminals 53. Thereby, it is possible to achieve a reversed planar electrode type arrangement in which all of the leads are extended out from the back side of the device.

The segment type monolithic electroluminescent numerical display device as hereinabove described is made by employing a light-emitting diode consisting of one chip measuring 5 mm square. The device provides a very good numerical display, due to a high degree of electrical isolation between the segments which causes a limited and an effective flow of an electric current for one of the principal effects of the present embodiment.

As is obvious from the present embodiment, a monolithic segment display device is provided of a high quality which can be made by a very easy process because ZnS, and ZnTe, etc. are easily applicable in addition to ZnSe as described above, the present embodiment provides a device construction which is very useful for making a highly efficient segment display device which can emit light covering the whole range of visible light.

Figure 4:
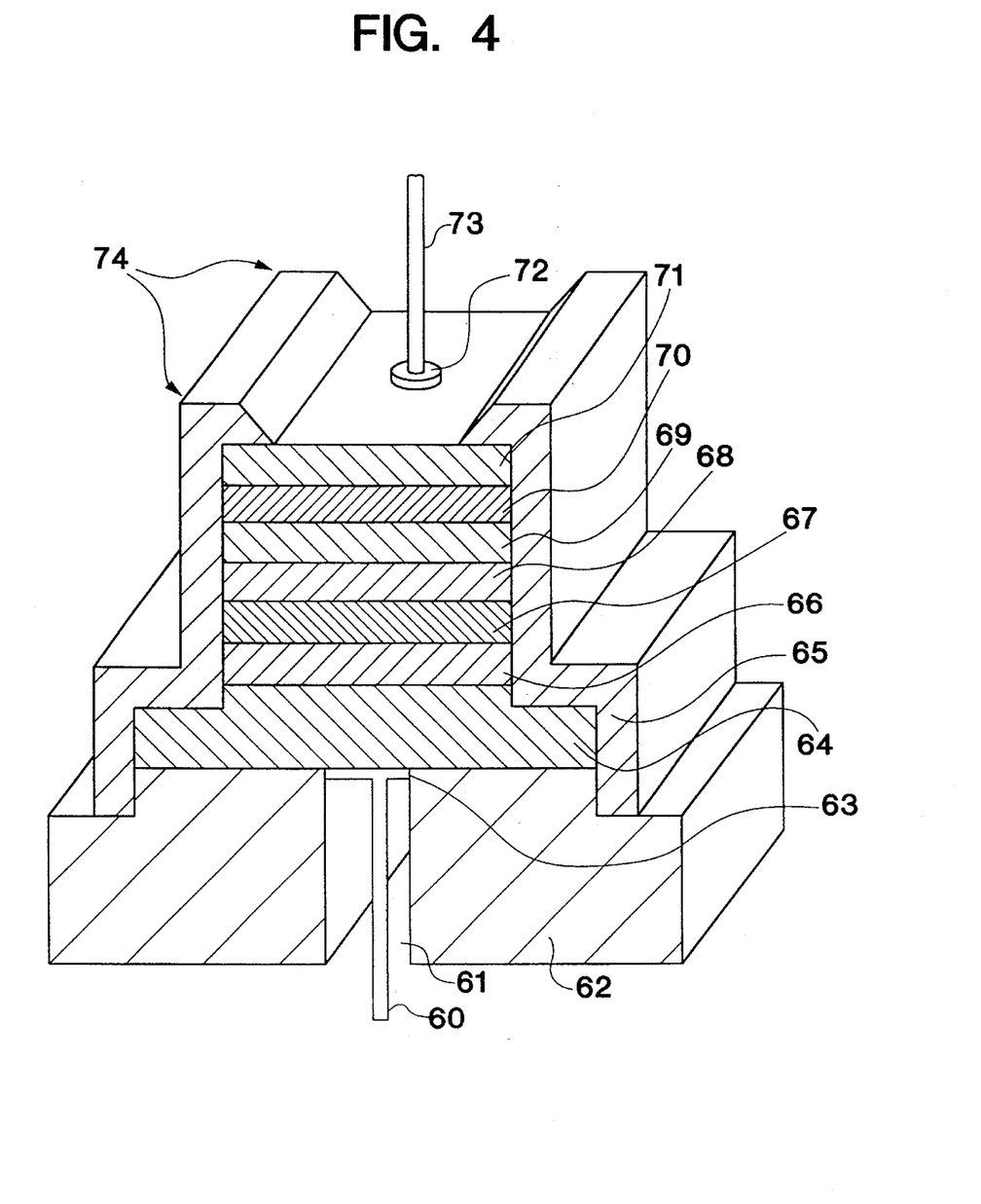

FIG. 4 is a perspective view of a ZnSe p-n junction type electroluminescent device according to a fourth embodiment of this invention. In FIG. 4, element 60 is a metal lead wire, element 61 is a through groove, layer 62 is an insulating single-crystal ZnS substrate of high resistance having a resistivity of $10^8$ to $10^{10}$ $\Omega$·cm, element 63 is a metal electrode, layer 64 is a low-resistance p-type epitaxial ZnS$_\alpha$Se$_{(1-\alpha)}$ ($\alpha$=0.5 to 0.8) buffer layer, layer 65 is a high-resistance ZnS protective layer, layer 66 is a low-resistance p-type epitaxial ZnS$_\beta$Se$_{(1-\beta)}$ ($\beta$=0.3 to 0.6) conductive layer, layer 67 is a low-resistance p-type ZnSe epitaxial conductive layer, layer 68 is a low-resistance p-type ZnSe epitaxial light-emitting layer, layer 69 is a low-resistance n-type ZnSe epitaxial light-emitting layer, layer 70 is a low-resistance n-type ZnSe epitaxial conductive layer, layer 71 is a low-resistance n-type ZnS$_\gamma$Se$_{(1-\gamma)}$ ($\gamma$=0.1 to 0.3) epitaxial conductive layer, element 72 is a metal electrode, element 73 is a metal lead wire, and element 74 is a plane of cleavage. The device is formed by MBE or MOCVD, and RIE processes.

Referring to the carrier concentrations and thicknesses of the epitaxial layers forming the device, the p- and n-type layers forming the p-n junction of ZnSe have a hole density of $5\times10^{15}$ cm$^{-3}$ an electron density of $1\times10^{16}$ cm$^{-3}$, respectively, and a thickness of 0.5 microns (both of the p- and n-type layers), while the outer p- and n-type layers adjoining the junction have a hole density of $1\times10^{18}$ cm$^{-3}$ an electron density of $5\times10^{18}$ cm$^{-3}$, respectively, and a thickness of 2 and 3 microns, respectively. The p-type conductive layer 64 and the substrate 62 are each formed with a shoulder by a two-step RIE process, whereby a path of an electric current in the p-n junction is narrowed. After the shoulders are formed, the high-resistance ZnS protective layer 65 is formed in a chamber of MBE connected to an ultrahigh vacuum chamber for ion-beam etching, by employing a manipulator provided with a substrate rotating mechanism capable of inclining the axis of rotation of the substrate to the average axis of a molecular beam, and rotating the substrate at a speed of 20 rpm, while the line normal to the center of the substrate is held at an angle of 45° to the average axis of the molecular beam.

The through groove 61 for the electrode and the metal electrodes 63 (Au) and 72 (In) are formed as hereinabove described, and the plane 74 of cleavage is formed perpendicularly to the protective ZnS layer 65, in order to obtain the device. The device had an area of 300×500 microns and a total epitaxial layer thickness of 16 microns.

The device has an overall serial resistance which is as low as about 5 ohms, and permits the flow of up to about 2 A of an electric current (pulsed) the application of a voltage of 15 V. The device produces light having very high brightness with a peak wavelength of 460 nm and a half-value width of 1 nm.

As is obvious from the present embodiment, a device is provided which is formed mainly from epitaxial layers of high quality and is, therefore, suitable as a high-output electroluminescent device and permits the use of a high electric current.

It is obviously possible to make an electroluminescent device of equally high quality by forming the electroluminescent part from other materials, such as ZnTe, ZnSe$_z$Te$_{(1-z)}$ or ZnS$_w$Se$_{(1-w)}$ (0.1<w<0.7), as in the embodiments hereinabove described.

Figure 5:
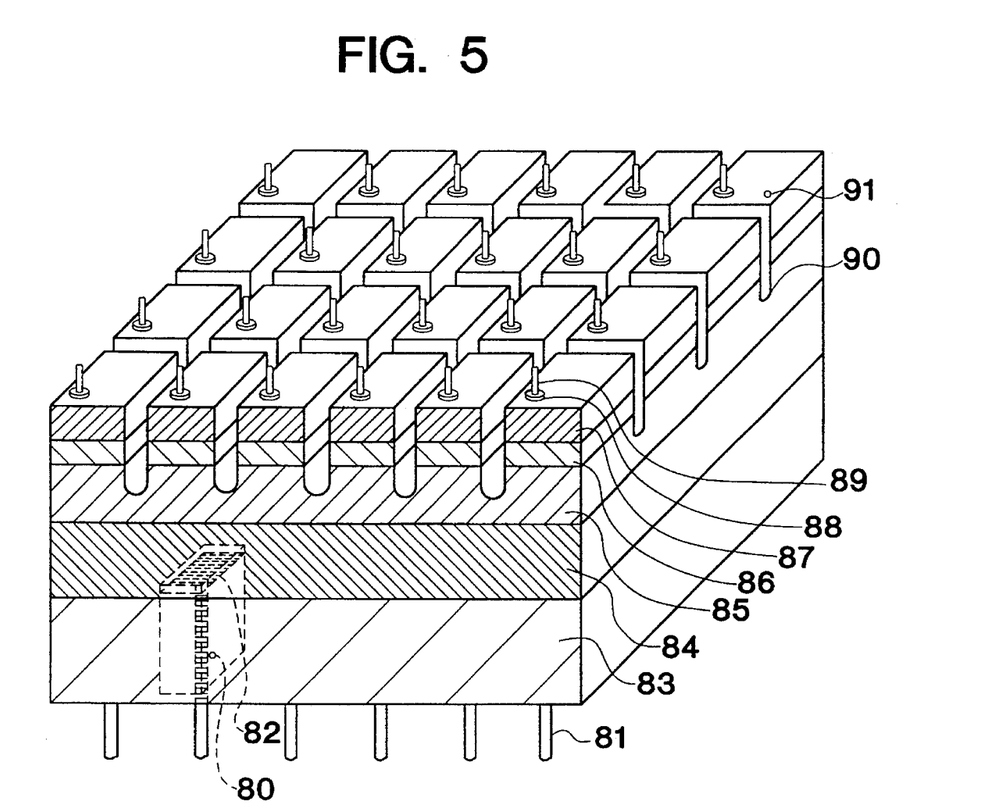

FIG. 5 is a perspective view of a display device according to a fifth embodiment of the present invention and is capable of emitting blue light having a high degree of brightness. In FIG. 5, element 91 is an individual electroluminescent unit, element 80 is a pair of electrodes forming rectangular through holes that are formed in each individual unit, elements 81 and 89 are lead wires, elements 82 and 88 are metal electrodes, layer 83 is an insulating single-crystal ZnSe substrate having a resistivity of $10^6$ to $10^8$ $\Omega$·cm, layer 84 is a p-type ZnSe conductive layer, layer 85 is a p-type ZnSe light-emitting layer, layer 86 is an n-type ZnSe light-emitting layer, layer 87 is an n-type ZnSe conductive layer, and element 90 is a channel for separating one device from another.

The multiple layers in the device are formed by the same process as employed in the device of the second embodiment. The individual electroluminescent units are separated from each other by the channels 90 which are etched to extend into the p-type light-emitting layer 85. The metal electrode 82 (Au) is formed at the bottom of the through hole 80 and contacts the p-type ZnSe conductive layer 84. The shape of the holes 80 in the substrate 83 determines the shape of a pattern of emitted light. The device illustrated in FIG. 5, therefore, emits light in a rectangular pattern from substantially the whole surface of each unit. The units of the device illustrated in FIG. 5 can be divided easily into very small regions each measuring 100 microns square, whereby an electroluminescent display of high accuracy is possible.

The device is made in a wide dimensional range of 5 to 20 mm square and all such devices provide a very clear display of not only characters and numerals, but also images. These display device are not only useful alone, but also can be integrated to make a large-area display apparatus.

As is obvious from the present embodiment, a basic construction is provided which is suitable for a highly integrated large-area light-emitting diode apparatus.

The basic construction of the compound semiconductor electroluminescent device according to the present invention enables the use of an insulating or semiinsulating bulk single-crystal of a compound semiconductor of high resistance for the substrate. Therefore, the conventional process of heat treating a bulk single-crystal at a high temperature for a long time to lower the resistance of the substrate and the conventional process of forming an ohmic electrode on the crystal of lowered resistance is eliminated, and the process for manufacturing an electroluminescent device is drastically simplified. The present invention is of great value from both technical and economical standpoints in the manufacture of a semiconductor device for emitting light having a short wavelength, including blue and ultra-violet light.

Moreover, the present invention greatly facilitates the realization of various kinds of devices which have hitherto not been available, such as an electroluminescent device emitting light of high brightness with a small loss and a high efficiency, a high-output device, a monolithic display device and a highly accurate large-area electroluminescent display apparatus, by virtue of the advantages which includes the following:

(1) Any loss that has hitherto been caused by the residual resistance in the substrate after the heat treatment for lowering resistivity, can be eliminated for enabling a reduction of loss for the device of the present invention;

(2) An insulating substrate which acts as an effective isolator between the electrodes, is used;

(3) The electric current flows through very thin epitaxial layers having a restricted path defined by the shape and dimensions of the electrode, as is obvious from the foregoing description of the preferred embodiments.

It is, therefore, evident that the present invention can produce very great economical merit in the field of display technology, and can be quite effective in applications for information display apparatus of high resolution.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What we claimed is:

1. An electroluminescent device of compound semiconductor having a plurality of electroluminescent portions comprising:

a semiconductor substrate having a plurality of through-holes bored therein;

an electroluminescent device layer formed of a plurality of epitaxially grown layers on said substrate;

a plurality of first electrodes being directly connected to said electroluminescent device layer through each of said through-holes;

a second electrode being formed opposite to said first electrodes with said electroluminescent device layer sandwiched between said first and second electrodes; and a plurality of grooves formed on the surface opposite to the substrate, said grooves dividing said electroluminescent device layer into the plurality of electroluminescent portions, and said grooves having a thickness which is thinner than a thickness of said electroluminescent device layer, said grooves extending to a lighting layer in said electroluminescent device layer.

2. An electroluminescent device of claim 1, wherein said substrate has a resistance of $10^6$ to $10^8$ $\Omega \cdot$cm.

3. An electroluminescent device of claim 2, which comprises a substrate having a plurality of grooves extending to through-holes and a first electrode connecting a lead line formed in said through holes and said grooves.

* * * * *